US006703683B2

(12) United States Patent
Tanimura

(10) Patent No.: US 6,703,683 B2
(45) Date of Patent: Mar. 9, 2004

(54) CHIP RESISTOR AND METHOD FOR MANUFACTURING THE SAME

(75) Inventor: Masanori Tanimura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/873,247

(22) Filed: Jun. 5, 2001

(65) Prior Publication Data

US 2002/0031860 A1 Mar. 14, 2002

(30) Foreign Application Priority Data

Apr. 20, 2000 (JP) .......................................... 2001-123169
Jun. 5, 2000 (JP) .......................................... 2000-168062

(51) Int. Cl.$^{7}$ .......................... H01L 29/00; H01C 1/012

(52) U.S. Cl. ....................... 257/536; 257/775; 338/309; 338/332

(58) Field of Search ................................ 257/516, 536, 257/537, 774, 775, 904; 338/306, 308, 309, 332

(56) References Cited

U.S. PATENT DOCUMENTS 4,792,781 A * 12/1988 Takahashi et al. .......... 338/307
6,005,474 A * 12/1999 Takeuchi et al. ............ 338/320
6,128,199 A * 10/2000 Kambara .................... 361/760
6,314,637 B1 * 11/2001 Kimura et al. ................ 29/620
6,356,184 B1 * 3/2002 Doi et al. .................... 338/309
6,387,794 B2 * 5/2002 Bessho ........................ 438/613
2001/0027007 A1 * 10/2001 Hosomi et al. ............. 438/611

* cited by examiner

*Primary Examiner*—Amir Zarabian
*Assistant Examiner*—Pamela E Perkins
(74) *Attorney, Agent, or Firm*—Arent Fox Kintner Plotkin & Kahn, PLLC

(57) ABSTRACT

A resistance element (4) is provided by a thin film on the surface of an insulating substrate (1) consisting of, for example, alumina, and having a rectangular planar shape, so as to extend from one end to the opposite other end thereof. Connected to the opposite ends of the resistance element, respectively, top surface electrodes (21) (21*a*, 21*b*), (31) (31*a*, 31*b*) and back surface electrodes (22), (32) are formed by a thick film, on the surface and the other side at the opposite ends of the insulating substrate, and the top surface and back surface electrodes are electrically connected by thick-film electrodes such as side surface electrodes (23), (33). A protective film (5) (51 to 53) is provided on the surface of the resistance element. By having such a construction, since the resistance element is formed by a thin film, and other electrodes are formed by a thick film, the accuracy of resistance value and high resistance characteristics such as noise performance can be improved, and productivity can be improved.

6 Claims, 8 Drawing Sheets

CHIP RESISTOR AND METHOD FOR MANUFACTURING THE SAME

FIELD OF THE INVENTION

The present invention relates to a chip resistor in which a resistor film is provided on a chip-type insulating substrate and a manufacturing method thereof. More specifically, the present invention relates to a chip resistor and a manufacturing method thereof, wherein the manufacturing process is simple to enable economical production, while high-performance properties can be obtained.

BACKGROUND OF THE INVENTION

Conventional chip resistance element include a thick-film resistor wherein electrodes and resistance element are formed by printing and firing, and a thin-film resistor wherein electrodes and resistance element are formed by sputtering. Though there are differences in the thick film and the thin film, and in the upper and lower sides of the resistance element and the top electrodes, the structures thereof are almost the same, and for example, are as shown in FIG. 14. That is to say, in FIG. 14, a pair of electrodes 2, 3 are formed of top surface electrodes 21, 31, back surface electrodes 22, 32, and side surface electrodes 23, 33 connecting these top and back surface electrodes, at both of the opposite ends of an insulating substrate 1 comprising alumina or the like, and a resistance element 4 is formed on the insulating substrate 1, so as to be connected to the both electrodes. A protective film 5 is also formed in one to three layers on the surface side of the resistance element. The thick film is formed in a thickness of, for example, 5 to 10 $\mu$m, and the thin film is formed in a thickness of, for example, 0.1 to 0.5 $\mu$m.

The thick-film resistor is obtained by applying a paste material by printing or the like using a glass or a resin, and firing the material at 600 to 900° C. (in the case of glass) or curing this at 200 to 240° C. (in the case of resin), to thereby form each layer. As an electrode material, a metal paste of an Ag type in which Pd is added to Ag, or an Au type in which Au is used as a main component is used. As a resistance element material, there is used one obtained by mixing Ag or the like in ruthenium oxide ($RuO_2$) in order to have a necessary value of resistance, and forming a paste by a glass or a resin. Also, the thin-film resistor is obtained by forming a film from a metal material by sputtering or the like and patterning this film. As the electrode material, Al, Ni, Cr or Cu is used, and as the resistance element material, an Ni—Cr alloy or the like is used.

Thus, the manufacturing processes are different in that one is provided by printing and heat processing, and the other is provided by sputtering. Also these are different in view of equipment such as printing apparatus or sputtering apparatus, and the production line is quite different. Therefore, use of the both films together makes the production process complicated, and it is practically difficult.

As described above, there is a thick-film resistor or a thin-film resistor in chip resistor, and the thick-film resistor has an advantage in that the production equipment is very cheap, and such a resistor itself can be manufactured economically. However, since the resistance element is obtained by making a paste of ruthenium oxide, the accuracy of resistance value is poor based on the heterogeneous composition, the non-uniform thickness at the time of application, and a difference in dosage of Ag or the like in order to adjust the resistance value, and there is a problem in that it is inferior in performance, such as poor noise performance, as well. On the other hand, the thin-film resistor is excellent in the accuracy of resistance value and noise performance, but there is a problem in that expensive sputtering apparatus has to be used, and its production takes time, thereby making such a resistor considerably expensive.

On the other hand, if the thick film and the thin film are combined, not only the production line becomes complicated as described above, but also there are problems in that when a thick film is formed on a thin film, adhesion decreases, contact resistance increases, and the quality thereof is not uniform, though there is no problem in adhesion when a thin film is formed on a thick film.

SUMMARY OF THE INVENTION

In order to solve these problems, it is an object of the present invention to provide a chip resistor and a manufacturing method thereof, wherein accuracy of resistance value is improved, and productivity is improved, while increasing resistance characteristics such as noise performance.

It is another object of the present invention to provide a chip resistor capable of surface mounting, while improving a connection between a resistance element and electrodes, in case that a thin-film is used as the resistance element, and a thick-film is used as the electrodes.

The chip resistor according to the present invention comprises: an insulating substrate; a resistance element formed by a thin film so as to extend from one end to the opposite other end of the insulating substrate on the surface thereof; top surface electrodes formed by a thick film at the opposite ends of the insulating substrate, so as to be connected to the opposite ends of the resistance element, respectively; back surface electrodes formed by a thick film on the backside of the insulating substrate, the back surface electrodes being electrically connected to the top surface electrodes via thick-film electrodes, respectively; and a protective film provided on the surface of the resistance element.

The thick film herein stands for a film formed thick by applying materials of an electrode or a resistance element in a paste form and firing or curing this paste, and the thin film stands for a film formed thin by directly forming a metal film or the like by sputtering or the like.

By having such a construction, since a resistance element is formed by a thin film, the resistance performance such as accuracy of resistance value and noise performance can be obtained with high accuracy. On the other hand, since electrodes and the like are formed by a thick film, the production process becomes simple, enabling economical production.

Specifically, the construction may be such that each of the top surface electrodes comprises a first top surface electrode and a second top surface electrode, and each of the opposite ends of the resistance element is clamped in a sandwich construction by the first top surface electrode and the second top surface electrode provided on the surface of the insulating substrate, with a part of each of the opposite ends of the resistance element removed so that the first top surface electrode and the second top surface electrode come in direct contact with each other, and the second top surface electrode and each of the back surface electrodes are connected by a side surface electrode formed by a thick film on the side of the insulating substrate, respectively.

By having such a construction, a part of the resistance element is removed so that the first top surface electrode and the second top surface electrode come in direct contact with each other, and the first top surface electrode and the second top surface electrode are both formed by a thick film. Hence, these have excellent adhesion. The resistance element sandwiched therebetween has excellent adhesion with the first top surface electrode, since it is a thin film on a thick film, and can be also connected electrically with the second top surface electrode via the first top surface electrode with low resistance. As a result, even if a side surface electrode or a bump electrode is provided in a thick film on the second top surface electrode, both of the second top surface electrode and the side surface electrode are similarly thick film and have good adhesion. Hence, an electrode structure having excellent contact state can be obtained.

Another specific construction may be such that the resistance element formed by a thin film comprises a laminated structure having a first layer and a second layer, each of the opposite ends of the resistance element clamps the top surface electrode between the first layer and the second layer in a sandwich construction, and the first layer is provided with an exposed portion of the insulating substrate so that the top surface electrodes come in direct contact with the insulating substrate, and the second layer is formed such that the top surface electrode has an exposed portion not covered with the second layer.

By having such a construction, the top surface electrode is provided so as to come in direct contact with the insulating substrate through the exposed portion formed in the first layer, and hence, these have good adhesion. Moreover, since the top surface electrode and the second layer have good adhesion, since these are in the relation of a thin film on a thick film, and both resistance elements have good adhesion, since these are thin films. Thus, the top surface electrode and the resistance element are connected with good adhesion.

Moreover, another specific construction is such that the resistance element is formed on the insulating substrate, each of the top surface electrode is formed on the opposite ends of the resistance element, and thin-film top surface electrodes are formed so as to cover a part of each of the top surface electrode and a part of the resistance element at the opposite ends, and the exposed portion of each of the top surface electrodes and each of the back surface electrodes is connected by a side surface electrode provided by a thick film on the side of the insulating substrate. That is, in the above construction, by having such a construction that the second layer of the resistance element is provided only at the opposite ends, or by using an electrode material as the material provided at the opposite ends, the adhesion can be improved from the same reason as above.

As further another specific construction, there can be mentioned a construction, in which through holes are formed at the opposite ends of the insulating substrate, and through hole electrodes are formed by a thick film in the through holes so as to respectively connect each of the top surface electrodes and each of the back surface electrodes, and the resistance element is formed so that the opposite ends of the resistance element overlap on the top surface electrodes.

By having such a construction, while using a thin-film resistance element and thick-film top surface electrodes, the top surface electrodes can be connected to the back surface electrodes by thick films, without overlapping the top surface electrodes on the thin-film resistance element, thereby enabling connection with good adhesion. Moreover, a protective film can be formed on the top surface electrodes, so the material that is not easily diffused into the resistance element can be used for the top surface electrodes, without taking into consideration corrosion due to solder plating.

By forming each of the through holes such that the longitudinal section thereof is not exposed to the side of the insulating substrate, a fillet-less construction can be obtained at the time of soldering for mounting, thereby enabling reduction in the mounting area.

By having such a construction that the longitudinal section of each of the through holes is exposed on the side of the insulating substrate, and each of the through hole electrodes is substantially filled in the through holes, to thereby expose each of the through hole electrodes substantially in a flat face on the side of the insulating substrate, the thin-film resistance element and the thick-film electrode can be connected with good adhesion, while keeping the same shape as that of the structure for connecting the top surface electrodes and the back surface electrodes with a conventional side surface electrodes.

Further another aspect of the chip resistor according to the present invention comprises: a pair of first top surface electrodes formed by a thick film provided on the surface of the opposite ends of an insulating substrate; a thin-film resistance element provided on the substrate so that the opposite ends thereof respectively overlap on the first top surface electrodes; a pair of second top surface electrodes formed by a thick film provided on the first top surface electrode exposed by removing a part of the resistance element and on the surface of the opposite ends of the resistance element; a protective film provided between the pair of second top surface electrodes on the surface of the resistance element; and bump electrodes provided on the surface side of the second top surface electrodes so as to be electrically connected to the second top surface electrodes, respectively.

By having such a construction, there is no such a problem that the resistance value changes due to the forming situation of solder fillets on the side surface electrodes. In addition, the chip resistor can be mounted in a very small area, without protruding from the flat surface area of the chip resistor.

A manufacturing method of a chip resistor according to the present invention comprises the steps of: (a) providing a pair of first top surface electrodes at the opposite ends of an insulating substrate by a thick-film forming method; (b) forming a resistance element film on the first top surface electrodes and the exposed insulating substrate by a thin-film forming method, and performing patterning so as to expose a part of each of the first top surface electrodes and to have a desired shape to thereby form a resistance element; and (c) providing a pair of second top surface electrodes by a thick-film forming method, so as to overlap on the pair of first top surface electrodes.

DETAILED DESCRIPTION

Figure 1:
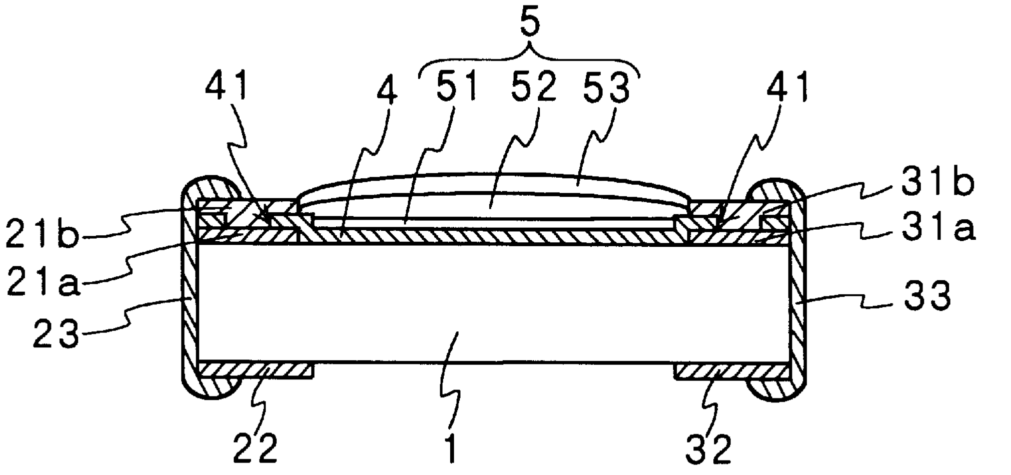
FIG. 1 is a cross section drawing showing one embodiment of a chip resistor according to the present invention.

A chip resistor of the present invention will now be described with reference to the drawings. In the chip resistor according to the present invention, a resistance element 4 is provided in a thin film on the surface of an insulating substrate 1 consisting of, for example, alumina, and having a rectangular planar shape, so as to extend from one end to the opposite other end thereof. Connected electrically to the opposite ends of the resistance element, respectively, top surface electrodes 21 (21*a*, 21*b*), 31 (31*a*, 31*b*) and back surface electrodes 22, 32 are formed by a thick film, on the surface and the other side at the opposite ends of the insulating substrate 1, and the top surface and back surface electrodes are electrically connected by thick-film electrodes such as side surface electrodes 23, 33. A protective film 5 (51 to 53) is provided on the surface of the resistance element 4. Since the figures including the ones described below are for explaining the construction, the thickness relation between the thin film and the thick film is not accurately indicated.

That is to say, the chip resistor according to the present invention is characterized in that only the resistance element 4 that largely affects the resistance characteristics such as resistance value accuracy and noise is formed by a thin film, using a sputtering method or the like, and other top surface electrodes 21, 31, back surface electrodes 22, 32 and side surface electrodes 23, 33 are formed by a thick film, to thereby simplify the production process. In this case, there is a problem in that in a mixture body of a thin film and a thick film, particularly when a thick film is formed on a thin film, the adhesion thereof decreases, causing an increase in the connection resistance, and in an extreme case, peeling easily occurs. However, with the present invention, in the case where a thick-film electrode is formed on a thin-film resistor, there are provided means for improving the adhesion.

That is, in the example shown in FIG. 1, it is characterized by a sandwich construction wherein the top surface electrodes 21, 31 are divided into the first top surface electrodes 21*a*, 31*a* and the second top surface electrodes 21*b*, 31*b*, and the resistance element 4, being a thin film, is clamped between the first top surface electrodes 21*a*, 31*a* and the second top surface electrodes 21*b*, 31*b*, and through holes 41 are provided in a part of the opposite ends of the resistance element 4, on the first top surface electrodes 21*a* and 31*a*, to thereby bring the first top surface electrodes 21*a*, 31*a* and the second top surface electrodes 21*b*, 31*b* into close contact with each other.

AS the substrate 1, for example, alumina, sapphire or Si wafer is used. As the thick-film electrode material, there is generally used one obtained by mixing a metal powder and glass or a resin and forming this mixture into a paste, and Ag type, Ag—Pd type or Au type is used, depending on the mixed metal powder. Here, "type" means that other elements may be added, using Ag or Au as a main component. A glass paste is cured by firing at a temperature of from 600 to 900° C., and a resin paste is cured by elevating the temperature to 200 to 240° C.

The construction shown in FIG. 1 shows a chip resistor having a structure that can be soldered on a mounting board such as a printed board by surface mounting, utilizing a side electrode from the backside of a conventional substrate 1. That is to say, thick-film back surface electrodes 22, 32 are formed by printing and firing a paste (Au type paste) in which Au and a glass component are mixed and formed in a paste by an organic solvent, on the backside of the substrate 1 corresponding to the top surface electrodes 21, 31 provided at the opposite ends of the substrate 1. Then, the first top surface electrodes 21*a*, 31*a* are formed from the same electrode material as the back surface electrode. After the resistance value of the resistance element 4 has been adjusted, and second top surface electrodes 21*b*, 31*b* are formed of an Ag type resin paste, an electrode material comprising a resin paste is printed on the side of the substrate 1 so as to overlap on the second top surface electrodes 21*b*, 31*b* and the back surface electrodes 22, 32 and cured, to thereby form side surface electrodes 23, 33 by a thick film. Though not shown, an Ni plating and solder plating are applied on the exposed faces of the electrodes 2, 3.

The resistance element 4 is formed in a thin film by forming a film of, for example, an Ni—Cr alloy, by sputtering, and patterning this into a desired shape using the photolithography technique. At the time of patterning, a part of the resistance element 4 on the first top surface electrodes 21*a*, 31*a* is also etched, to thereby form through holes 41, so that a part of the first top surface electrodes 21*a*, 31*a* is exposed. This through hole 41 may be provided not only singly but also in a plurality of numbers, or may have other shapes such as a slit. Then, when the second top surface electrodes 21*b*, 31*b* are formed thereon, the material of the second top surface electrode is filled in the through hole, so that the second top surface electrodes 21*b*, 31*b* are bonded in close contact with the first top surface electrodes 21*a*, 31*a*. As described above, the example shown in FIG. 1 has means for improving adhesion with the top surface electrodes 21*b*, 31*b* provided on the thin-film resistance element 4, by sandwiching the resistance element 4 between the first top surface electrodes 21*a*, 31*a* and the second top surface electrodes 21*b*, 31*b*, while bringing these electrodes into close contact with each other.

As the resistance element 4, in addition to the examples described above, metal films such as Ta type, Ta—N type and Ta—Si type metal films can be selected and used depending on a desired value of resistance. Here, "type" means that the resistance can be adjusted by adding Al, Cr, O or the like.

In the example shown in FIG. 1, the protective film 5 consists of three layers, but it need not have three layers, and a single layer or two layers may be used. The first protective film 51 is formed by forming a film of, for example, an insulating substance by a thin-film forming method. This first protective film 51 is provided for preventing the scribed resistance material from scattering and adhering on the resistance element 4 again, to thereby change the performance, in a step of scribing a part of the resistance element 4 by laser trimming to adjust the resistance value of the resistance element 4, while measuring the resistance thereof, after the resistance element 4 has been formed. Therefore, if there is no worry about this problem, it need not be provided.

The second protective film 52 and the third protective film 53 are coated on the first protective film 51 having an uneven surface due to the laser trimming, for protecting the surface of the exposed resistance element 4, and for protecting the whole surface of the chip resistor. Since only the second protective film 52 cannot fill the groove due to the laser trimming completely and make it flat, the third protective film 53 is further provided, to thereby completely cover the surface and make it flat. When these second and third protective films 52, 53 are fired at a high temperature, the resistance value of the resistance element 4 may change. Therefore, it is desired that a resin paste comprising an epoxy resin or the like is applied thereon and cured at a temperature of from 200 to 240° C. However, a glass type paste using a borosilicate lead glass may be printed thereon, and sintered at a temperature of from 600 to 700° C.

Figure 2:
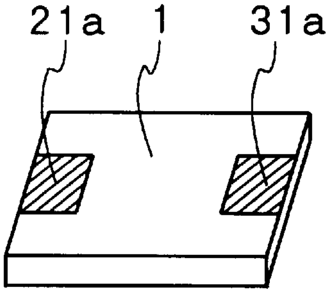
FIGS. 2(*a*) to 2(*c*) are process diagrams of a main part for manufacturing the chip resistor in FIG. 1.
Figure 2:
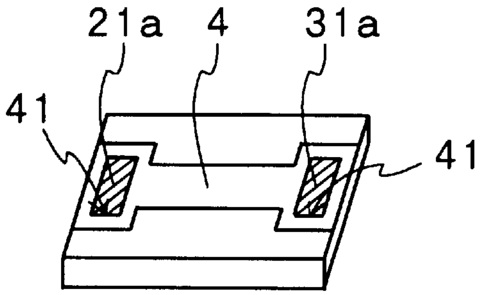
Figure 2:
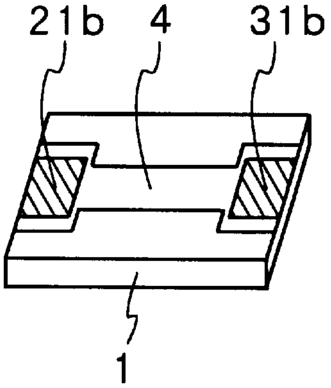

Next, the manufacturing method of this chip resistor will be described with reference to the process diagram of the main part shown in FIG. 2 and the flowchart shown in FIG. 3. In FIGS. 2(*a*) to 2(*c*), a manufacturing process diagram for a single chip resistor is shown. However, at the time of actual production, electrodes and resistors of about 100 to 10,000 pieces are simultaneously formed on a large substrate of 5–10 cm×5–10 cm, and side electrodes are formed on the side exposed by cutting or dividing this into a bar shape, and thereafter, chip resistors joined in the bar shape are cut or divided into individual chips to thereby separate these chip resistors.

Figure 3:
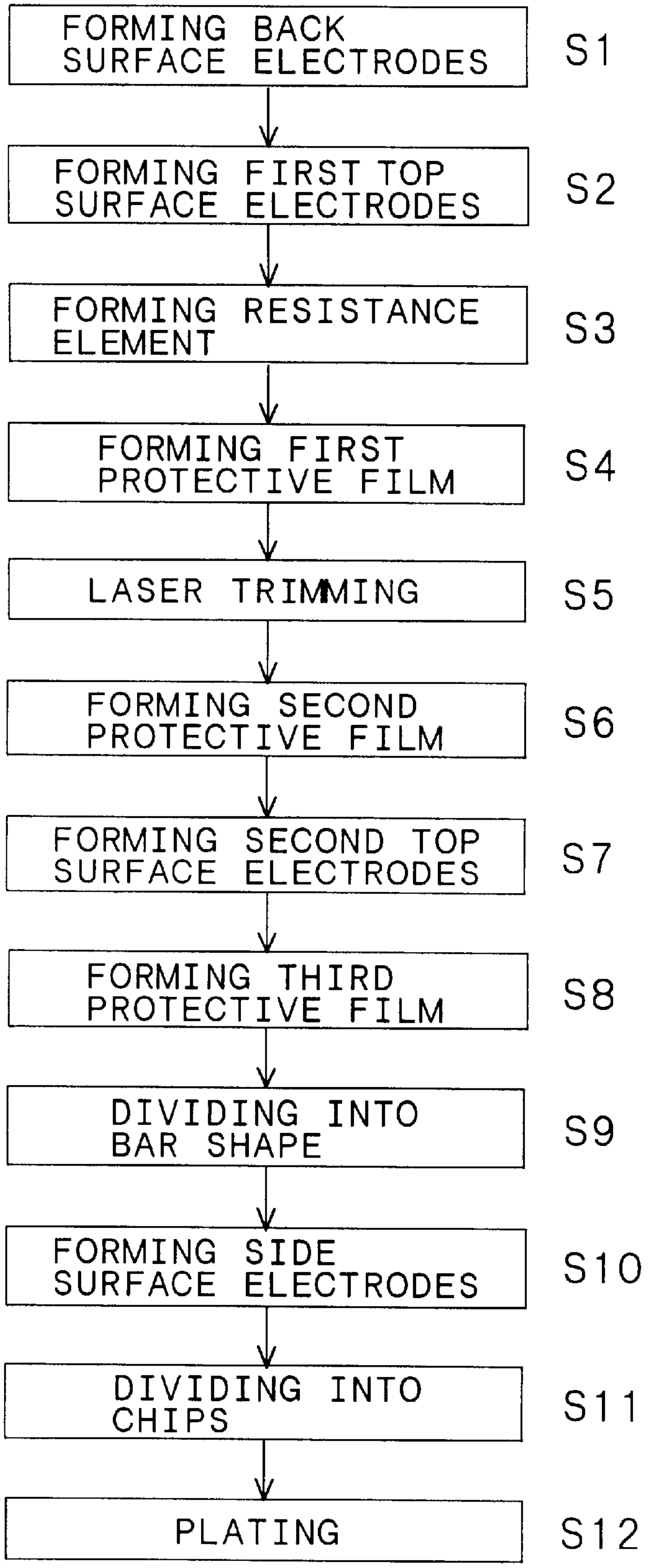
FIG. 3 is a flowchart in one example for manufacturing the chip resistor in FIG. 1.

At first, as shown in S1 in FIG. 3, a paste of an electrode material is printed on a predetermined position on the backside of the substrate. Then, the printed substrate is fired at a temperature of from 600 to 900° C. to thereby form the back surface electrodes 22, 32 (see FIG. 1). Then, the electrode material is applied by printing and fired on a predetermined position on the surface of the substrate (a portion corresponding to the back surface electrodes 22, 32), to thereby form first top surface electrodes 21*a*, 31*a* (S2, see FIG. 2(*a*)).

Thereafter, a thin-film resistance element film is formed on the whole surface of the substrate 1, and is patterned in a desired shape, to thereby form a resistance element 4. At this time, a part of the resistance element film on the top surface electrode is also etched so that a part of the first top surface electrodes 21*a*, 31*a* is exposed, respectively, to thereby form a through hole 41 (S3, see FIG. 2(*b*)).

Subsequently, a first protective film 51 is formed by forming a film of $Al_2O_3$, $SiO_2$ or SiN in a thin film on the surface of the resistance element 4, or applying a glass paste containing Pb glass or the like by printing, and firing this (S4). This step may be omitted. Then, laser trimming is performed to adjust the resistance value, so as to obtain a desired resistance value, while measuring the resistance value by bringing a probe electrode into contact with the pair of first top surface electrodes 21*a*, 31*a* (S5).

Moreover, a resin paste is applied on the surface thereof and cured, to thereby form a second protective film 52 (S6). This step may also be omitted. Then, a paste-form electrode material obtained by mixing, for example, Ag and a resin (Ag type resin paste) is applied on a part corresponding to the first top surface electrodes 21*a*, 231*a* and cured at 200° C., to thereby form thick-film second top surface electrodes 21*b*, 31*b* (S7, FIG. 2(*c*)). This step and the trimming step may be reversed.

Thereafter, the same material as that of the second protective film 52 is applied and cured, to thereby form a third protective film 53 on the resistance element 4 between the second top surface electrodes 21*b* and 31*b* (S8). This step and the forming step (S7) of the above second top surface electrodes 21*b*, 31*b* may be reversed. Then, the large substrate is cut or divided into a bar shape, with each in a line arranged in the direction vertical to the direction connecting the pair of electrodes 21 and 31 (S9).

Subsequently, an Ag type resin paste as an electrode material is applied and cured on the side of the substrate 1 between the top surface electrodes 21, 31 and the back surface electrodes 22, 32, so as to also overlap on the top surface electrodes and the back surface electrodes, to thereby form side surface electrodes 23, 33 (S10). Thereafter, chip resistors connected in a bar shape is divided into individual chips (S11), and Ni plating and solder plating comprising Pb/Sn or the like are performed on the exposed face of the electrode (not shown in FIG. 1), to thereby obtain the chip resistor shown in FIG. 1.

According to the present invention, since only the resistance element is formed by a thin film, and all the electrodes are formed by a thick film, man-hour in the manufacturing steps does not increase so much, thereby enabling an economical production. Moreover, since the resistance element that likely affects the resistance characteristics is formed by a thin film by sputtering, the metal thin film is formed in a uniform thickness by a uniform material, thereby a resistor having high accuracy can be obtained.

At this time, generally, when the thick-film electrode such as side surface electrode is formed on the thin-film resistance element, adhesion therebetween cannot be completely obtained, and contact resistance easily occurs. However, in the example shown in FIG. 1, the top surface electrode is divided into the first top surface electrode and the second top surface electrode, the first top surface electrode is formed below the thin-film resistance element, and the second top surface electrodes is formed above the thin-film resistance element, and a through hole is provided in at least a part of the thin-film resistance element on the first top surface electrode to thereby bring the first top surface electrode and the second top surface electrode into direct contact with each other. Hence, the first top surface electrode and the second top surface electrode are both thick films and have good adhesion, and the first top surface electrode and the thin-film resistor have also good adhesion, since these are in the relation of the thin film on the thick film. As a result, the contact resistance between the second top surface electrode and the resistance element becomes very small. Also, since the side surface electrode is formed by a thick film so as to come in contact with the second top surface electrode, the side surface electrode and the top surface electrode and the back surface electrode are all made of a thick film, and come in contact with each other with good adhesion and with a very low resistance. As a result, the resistance characteristic is not decreased. Furthermore, since a through hole is provided in the resistance element, the first top surface electrode provided on the backside of the resistance element is exposed, thereby giving an advantage in that probe contact to the electrode becomes easy at the time of laser trimming.

Figure 4:
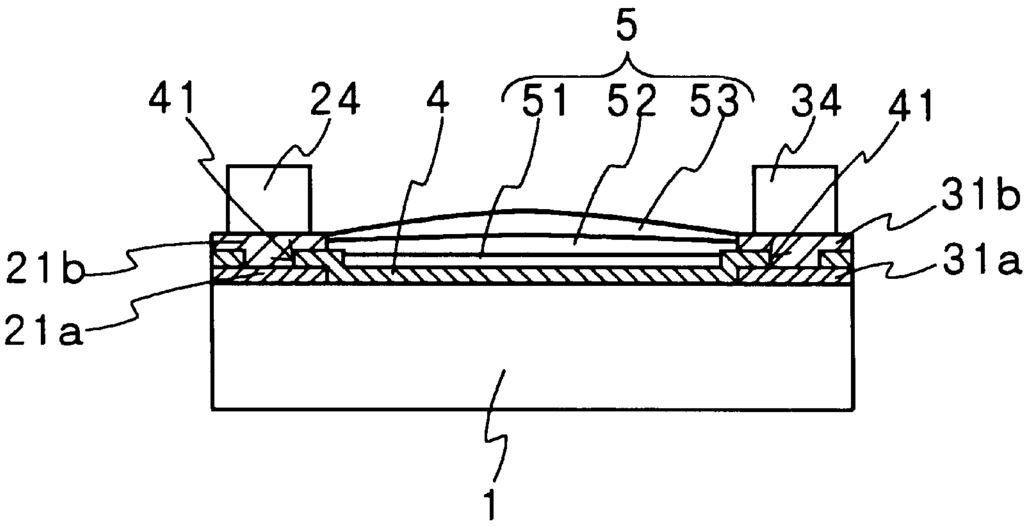
FIG. 4 is a cross section drawing showing another embodiment of a chip resistor according to the present invention.

FIG. 4 is a cross section drawing showing another embodiment of a chip resistor according to the present invention. The above example has a construction such that the back surface electrodes are formed on the backside of the substrate 1, the back surface electrodes being connected to the top surface electrodes via the side surface electrodes, and the back surface electrodes and the side surface electrodes make mounting possible to a circuit board such as a printed board. In this example, however, the construction is such that solder bumps are directly formed on the top surface electrodes, without forming the back surface electrodes and the side surface electrodes, thereby enabling direct soldering by face down bonding.

That is to say, in FIG. 4, the point that the top surface electrodes 21, 31 are formed of thick-film first top surface electrodes 21*a*, 31*a* and second top surface electrodes 21*b*, 31*b*, and a thin-film resistance element 4 having a through hole 41 is formed therebetween, and the first to third protective films 51 to 53 are formed is the same as the case shown in FIG. 1, and the same reference symbols are given to the same parts, and description thereof is omitted. In the example shown in FIG. 4, the characterized point is that the back surface electrode and the side surface electrode are not provided, and bump electrodes 24, 34 are formed by solder bumps. These bump electrodes 24, 34 are formed by applying a paste-form solder agent by printing or the like on the second top surface electrodes 21*b*, 31*b*, and curing this at a temperature of from 100 to 300° C.

By having such a construction, it is not necessary to form back surface electrodes and side surface electrodes, enabling reduction in man-hour, and the resistance value at the time of mounting becomes substantially the same as the resistance measured by parts, and hence the chip resistor can be used with stable performance. That is, as described above, in the case of the thick-film electrodes, when mounted by soldering using the back surface electrodes and the side surface electrodes, since the electrode itself has a resistance component due to glass or resin, a delicate change occurs in the resistance value, depending on the position in the side surface electrodes to which the solder fillet formed at the time of soldering, and accurate resistance value cannot be obtained. According to this embodiment, however, the solder bump hardly has a resistance component, and can be mounted with the same very accurate resistance value as the resistance measured as parts.

In each example described above, the means for improving adhesion between the thin-film resistance element and the thick-film electrodes (top surface electrodes 21, 31) provided thereon is a sandwich construction in which the top surface electrode is formed in two layers, with the resistance element being put therebetween. An example shown in FIG. 5 has such a construction that a resistance element is formed in two layers, and thick-film electrodes (top surface electrodes) are sandwiched therebetween, respectively, to improve the adhesion, and by exposing each of the top surface electrodes, connection with the side surface electrodes can be obtained.

Figure 5:
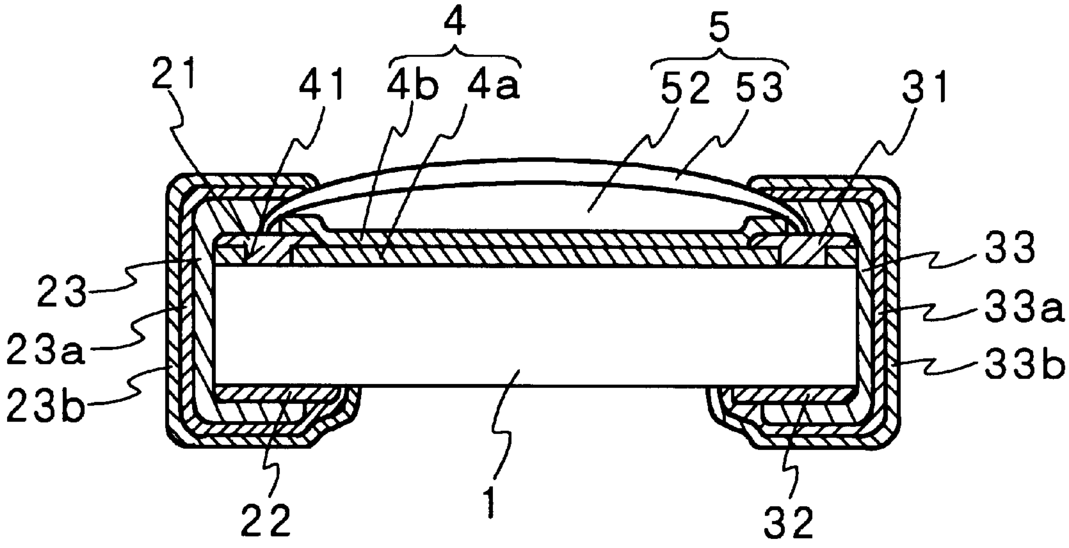
FIG. 5 is a cross section drawing showing still another embodiment of a chip resistor according to the present invention.

That is to say, in FIG. 5, a first layer 4*a* consisting of, for example, an Ni—Cr resistance element and a second layer 4*b* consisting of, for example, a TaN resistance element are both formed by a thin film by sputtering on an insulating substrate 1. At the opposite ends thereof, top surface electrodes 21, 31 formed by a thick film are sandwiched between the first layer 4*a* and the second layer 4*b*. These top surface electrodes 21, 31 are directly adhered on the insulating substrate 1 via through holes formed in the first layer 4*a*, and a part of the upper face of each of these is exposed from the second layer 4*b*, and the side surface electrodes are formed so as to be connected with the top surface electrodes 21, 31. Other construction is the same as in the example shown in FIG. 1 described above, and the same reference symbols are given to the same parts, and description thereof is omitted. In FIG. 5, a protective film 5 is shown in a two-layer structure, and Ni plating layers 23*a*, 33*a* and solder plating layers 23*b*, 33*b* are shown in the side surface electrodes 23, 33. Other materials for the insulating substrate 1 and the resistance element are the same as in the previous examples, and the description thereof is omitted.

Figure 6:
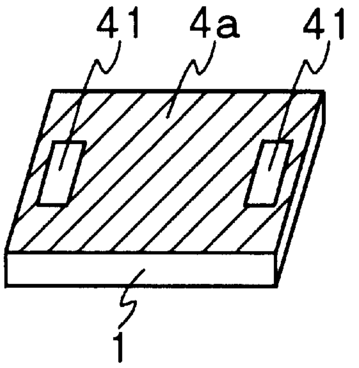
FIGS. 6(*a*) to 6(*d*) are process diagrams of a main part for manufacturing the chip resistor in FIG. 5.
Figure 6:
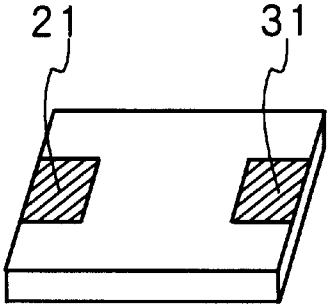
Figure 6:
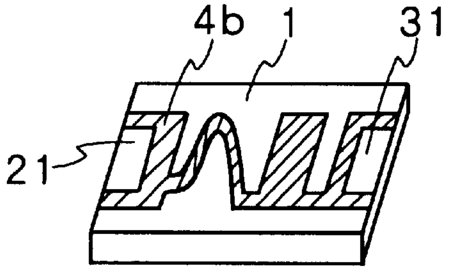
Figure 6:
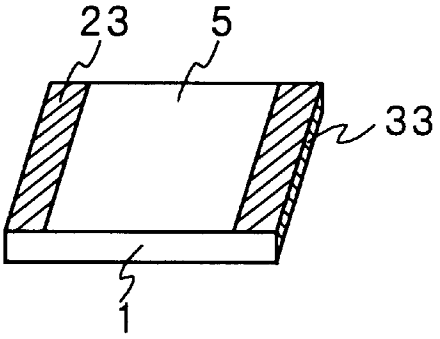

In order to manufacture this chip resistor, back surface electrodes are first formed by a thick film on the backside of the insulating substrate 1, and as shown in FIG. 6(*a*), a first layer 4*a* consisting of, for example, Ni—Cr is formed over the whole surface of the insulating substrate 1. The thickness of this film forming need not be about half of the example shown in FIG. 1, and the resistance value thereof can be adjusted by patterning, and film forming is performed in a necessary thickness in order to obtain a desired resistance. Then, through holes 41 are formed in a position where the electrode is formed at the opposite ends, using the photolithography technique in which a mask is formed and etching is performed, to thereby expose a part of the insulating substrate 1. At this time, the first layer 4*a* may be etched into a necessary pattern. However, when the second layer is also subjected to the same patterning, patterning may be performed after the second layer 4*b* is provided. Then, an annealing step is performed at a temperature of from 300 to 600° C. for about 30 to 100 minutes.

Moreover, as shown in FIG. 6(*b*), top surface electrodes 21, 31 are respectively formed by the similar thick film method, on a part where the through holes 41 are formed, at the opposite ends of the first layer 4*a* of the resistance element. These electrodes are formed, as in the previous examples, by printing, drying and curing or firing. That is, when the electrode material is a resin type, it is cured at a temperature of from about 200 to 240° C., and when a glass type material is used, it is fired at a temperature of from about 400 to 600° C.

Then, a second layer 4*b* consisting of, for example, TaN of the resistance element 4 is formed by the sputtering method in the similar manner as in the first layer 4*a*, and patterned in a desired shape. At this time, at the opposite ends, patterning is performed so as to expose at least a part of the top surface electrodes 21, 31. Moreover, when the first layer 4*a* and the second layer 4*b* are formed of a different material, an etchant suitable for respective etching is used. Thereafter, an annealing step is performed at a temperature of from about 300 to 600° C. Subsequently, the resistance value is adjusted by laser trimming, and the resin protective layers 52, 53 are formed in a necessary number of layers. Then, the substrate is cut into a bar shape, and side surface electrodes 23, 33 are formed (FIG. 6(*d*)), and then the substrate is cut into chips. Thereafter, the Ni plating layers 23*a*, 33*a* and the solder plating layers 23*b*, 33*b* are formed, to thereby obtain a chip resistor shown in FIG. 5. These steps are the same as in the previous examples.

According to the example shown in FIG. 5 and FIG. 6, each of the top surface electrodes 21, 31 provided on the first layer 4*a* of the thin-film resistance element is bonded with good adhesion with the insulating substrate 1 via the through hole 41 provided in the first layer 4*a*, while combining a thin-film resistance element having excellent characteristics and thick-film electrodes that can be economically manufactured. Also, since the second layer 4*b* of the thin-film resistance element 4 provided thereon is a thin film provided on a thick film, good adhesion can be obtained between the top surface electrodes 21, 31 and the second layer 4*b*.

Moreover, since the first layer 4*a* and the second layer 4*b* are both thin films, these have good adhesion to each other, and as a result, the top surface electrodes 21, 31 can be contacted with the thin-film resistance element 4 with good adhesion, and also with the insulating substrate 1 with good adhesion. Furthermore, according to this construction, by using materials in which positive and negative of the temperature coefficient becomes opposite, such as a combination of the above-described Ni—Cr and TaN, for the two-layer resistance element, a chip resistor having a stable resistance value not depending on the temperature can be obtained.

Figure 7:
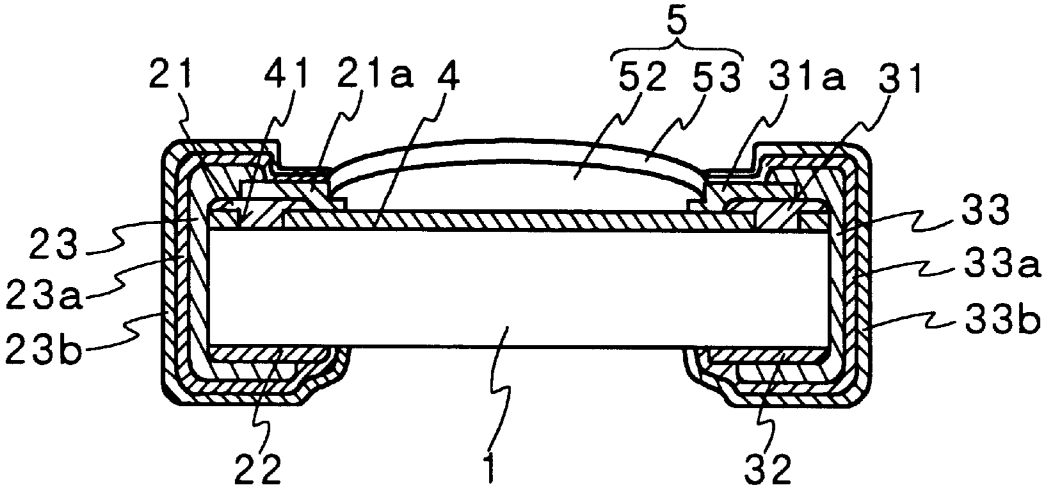
FIG. 7 is a cross section drawing showing further another embodiment of a chip resistor according to the present invention.

The example shown in FIG. 7 has a construction such that, instead of the second layer of the resistance element shown in FIG. 5, thin-film top surface electrodes 21*a*, 31*a* are formed only in the electrode portions, to sandwich thick-film top surface electrodes between thin films as in the example shown in FIG. 5, thereby having means for improving the adhesion of a thick-film electrode on a thin-film resistance element.

That is to say, in FIG. 7, the resistance element 4 comprises one layer and is directly provided on an insulating substrate 1, and through holes 41 are respectively formed at places where electrodes are formed at the opposite ends thereof, to thereby expose parts of the insulating substrate 1, and the top surface electrodes 21, 31 are formed thereon by a thick film. Up to this point, the construction is the same as the example shown in FIG. 5. However, in this example, instead of the second layer of the resistance element, the electrode material comprising, for example, Cu or Ni is provided in a thin film by sputtering on the top surface electrodes 21, 31 and on the resistance element 4 in the vicinity thereof to form thin-film top surface electrodes 21*a*, 31*a*. These thin-film top surface electrodes 21*a*, 31*a* may not be a material having excellent conductivity as described above, and may be formed by a resistive material.

Figure 8:
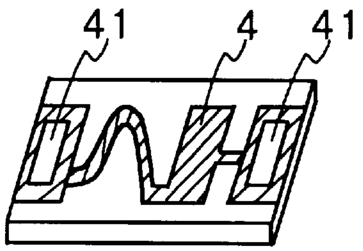
FIGS. 8(*a*) to 8(*d*) are process diagrams of a main part for manufacturing the chip resistor in FIG. 7.
Figure 8:
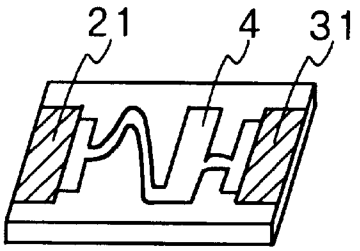
Figure 8:
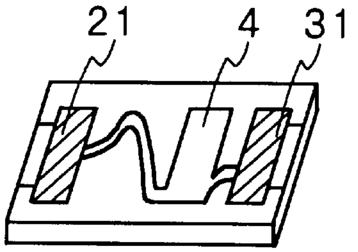
Figure 8:
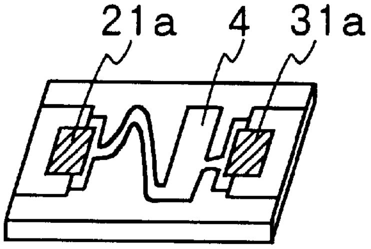
Figure 8:
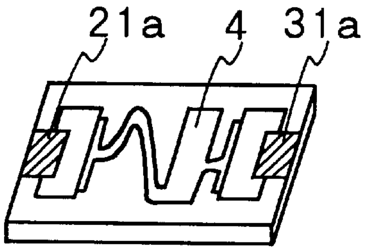
Figure 8:
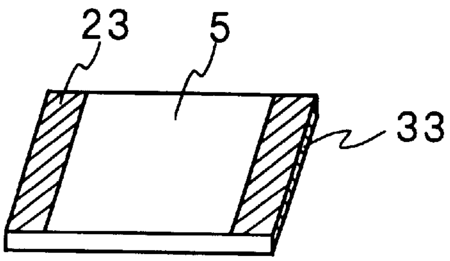

Next, the manufacturing method of this chip resistor will be described with reference to FIGS. 8(*a*) to 8(*d*). As shown in FIG. 8(*a*), a resistive material such as Ni—Cr is provided over the whole surface of the insulating substrate 1 by sputtering, and patterned in a desired shape by the photolithography technique. At this time, through holes 41 are formed at places where electrodes are formed at the opposite ends thereof, so as to expose parts of the insulating substrate 1. Then, as shown in FIG. 8(*b*), top surface electrodes 21, 31 are formed by the thick-film method similar to the example described above. At this time, the top surface electrodes 21, 31 adhere to the insulating substrate 1 via the through holes 41. The top surface electrodes 21, 31 may be formed such that these are not positioned to be exposed to the side of the chip resistor, but cover a part of the electrode connecting portion of the resistance element 4 and the exposed portion of the insulating substrate 1, as shown in FIG. 8(*b*').

Thereafter, a film of Cu or Ni is formed by sputtering over the whole surface, and patterned to thereby form thin-film top surface electrodes 21*a*, 31*a* comprising a thin film so as to cover a part of the top surface electrodes 21, 31 and a part of the resistance element 4, as shown in FIG. 8(*c*). At this time, when the top surface electrodes 21, 31 are formed in the inner part so as not to be exposed to the side of the insulating substrate 1, the thin-film top surface electrodes 21*a*, 31*a* are formed towards the sides of the insulating substrate 1, as shown in FIG. 8(*c*'), so as to cover both of the top surface electrodes 21, 31 and the resistance element 4. As a result, the thick-film top surface electrodes 21, 31 can be sandwiched between the thin-film resistance element 4 and the thin-film top surface electrodes 21*a*, 31*a*. Subsequently, in the same manner as described above, protective films 52, 53 are formed over the surface of the resistance element 4, the substrate is divided into a bar shape, and side surface electrodes 23, 33 are formed (FIG. 8(*d*)). Then, these bar-shaped substrate is cut into individual chips to form plating layers 23*a*, 33*a* and solder layers 23*b*, 33*b*. As a result, a chip resistor as shown in FIG. 7 can be formed.

Figure 9:
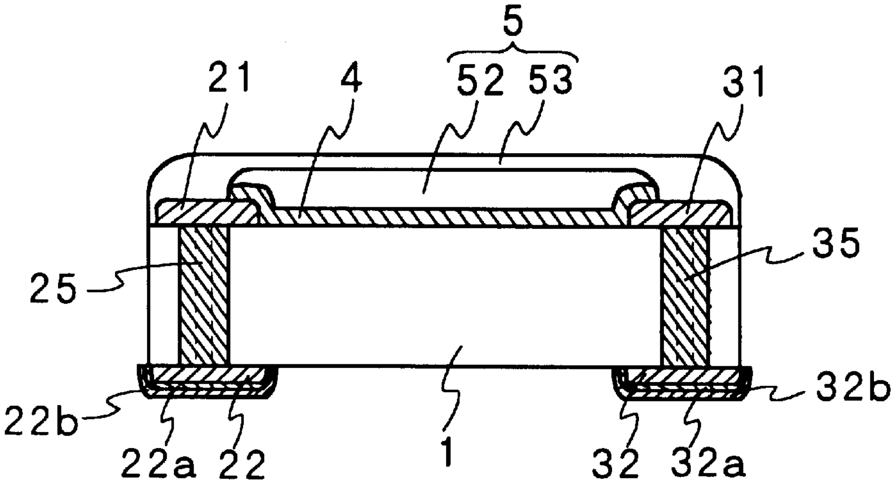
FIG. 9 is a cross section drawing showing further another embodiment of a chip resistor according to the present invention.
Figure 11:
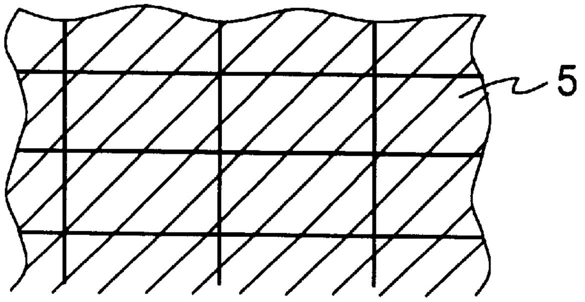
FIG. 11 is an explanation diagram in a protective film forming step at the time of manufacturing the chip resistor shown in FIG. 9.

The example shown in FIG. 9 is another structural example wherein back surface electrodes are formed in a thick film on the backside of an insulating substrate 1 so as to enable surface mounting, while improving adhesion between a thin-film resistance element and thick-film electrodes. That is to say, in this example, through holes are formed in the insulating substrate 1 beforehand, through hole electrodes 25, 35 are formed in the through holes, top surface electrodes 21, 31 are formed on the surface of the insulating substrate 1, while back surface electrodes 22, 32 are formed on the backside thereof, so as to be connected to the through hole electrodes 25, 35, and a resistance element 4 is formed by a thin film so as to overlap on the top surface electrodes 21, 31, on the surface of which a protective film 5 (52, 53) is formed. The outermost layer 53 of this protective film 5 can be coated over the whole surface, since there is no need to expose the top surface electrodes 21, 31, as is shown in a partly plane diagram in FIG. 11, wherein a multiplicity of chips are formed on a large substrate before being cut into individual chips.

In order to manufacture this chip resistor, through holes are formed at positions corresponding to the inner part than division lines, at the opposite ends when cut into individual chips, in the state of a large insulating substrate. Within the through holes, thick-film through hole electrodes 25, 35 are formed by printing and drying of a conductive electrode paste, and/or back surface electrodes 22, 32 are formed as a thick film, at the same time of formation of the through hole electrodes 25, 35, in the same manner by printing and drying of the conductive electrode paste, and firing at a temperature of from 200 to 870° C.

Then, top surface electrodes 21, 31 are formed similarly by a thick film on the surface side of the insulating substrate 1. Thereafter, a resistive material film such as Ni—Cr is formed by sputtering and patterned in a desired shape, to thereby form a resistance element 4, such that the opposite ends thereof overlap on the top surface electrodes 21, 31. In this case, a part of the top surface electrodes 21, 31 may be or may not be exposed on the surface. Thereafter, laser trimming is performed, while measuring the resistance value, to adjust the resistance value to a desired value.

Subsequently, a protective film 5 (52, 53) consisting of a glass or a resin is formed in one or two layers over the surface thereof. In this case, the protective film 5 may be formed by printing over the whole surface, as described above. When the protective film is a glass, after printing and drying, the film is fired at a temperature of from 500 to 650° C., and when protective film is a resin, it is cured at a temperature of from 200 to 240° C. Thereafter, electrodes are plated over the large substrate, to form Ni plating layers 22*a*, 32*a* and solder plating layers 22*b*, 32*b*. By dividing this substrate into individual chips, the chip resistor shown in FIG. 9 is obtained.

According to this example, even if thick-film electrodes are not formed on a thin-film resistance element, back surface electrodes provided on the backside of the insulating substrate and top surface electrodes can be electrically connected via through hole electrodes. As a result, while being constituted of a thin-film resistance element and thick-film electrodes, this chip resistor can achieve high performance by means of the thin-film resistance element and cost reduction by means of the thick-film electrodes, without causing a problem of adhesion between the thin-film resistance element and the thick-film electrodes.

Figure 10:
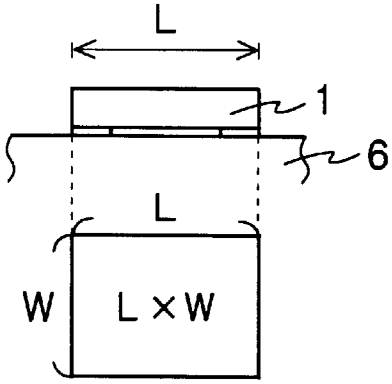
FIGS. 10(*a*) to 10(*b*) are diagrams showing the occupancy area at the time of mounting the chip resistor in FIG. 9, in comparison with a conventional chip resistor.
Figure 10:
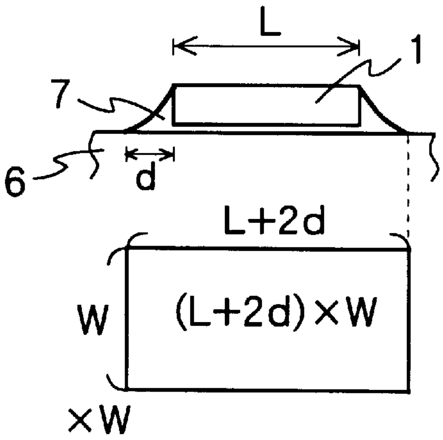

Furthermore, by having such a construction, since side surface electrodes are not exposed to the side of the insulating substrate, this chip resistor can be mounted to a mounting board or the like, without forming a solder fillet. That is, as shown in FIG. 10(*b*), with a conventional construction, if this is soldered to the mounting board or the like, there are formed a chip having a length L and a width W and a solder fillet 7 having a length d. As a result, the surface area occupied on the mounting board becomes (L+2d)×W. However, according to the chip resistor of the present invention, as shown in FIG. 10(*a*), this can be mounted in L×W. Since the chip resistor has a length L of from 0.6 to 1.6 mm, and d of from 0.1 to 0.2 mm, reduction of from 16.6 to 12.5% can be achieved as the occupancy area. With a recent compactization of electronic equipment, miniaturization of electronic parts is required, and the length L of the chip resistor is also miniaturized as described above. Therefore, the occupancy area can be further reduced, and there is a large advantage in the high-density packaging.

With regard to this fillet-less construction, as shown in FIG. 4 described above, also in the construction of mounting by face down bonding, by forming solder bumps on the top surface electrodes, the fillet can be removed to enable reduction of the mounting area. However, with a construction shown in FIG. 9, since face down bonding is not performed, there is an advantage in that the resistance element side can be exposed on the surface, enabling easy heat release.

Moreover, according to this embodiment, since the protective film can be formed over the whole surface including the top surface electrodes, as described above, the surface of the protective film can be made flat. As a result, even in the case where the surface side is adhered by a vacuum concrete at the time of mounting, reliable adhesion can be ensured, thereby improving the mountability. Furthermore, since the top surface electrodes are completely covered with the protective film, gas or water content can be suppressed from entering under the plating solution or under use environment, thereby enabling improvement in reliability.

For example, if the top surface electrodes are exposed, there is a problem of corrosion at the time of plating the electrodes, and in the case of an Au type electrode material, at the time of soldering, corrosion occurs due to being dissolved in the solder. Therefore, an Ag type electrode material is desirable. However, if an Ag type electrode material is used for the top surface electrodes, there is a problem in that Ag diffuses into the resistance element from a contact portion with the resistance element to thereby change the resistance value. Hence, it has been difficult to solve the both problems. However, according to this embodiment, since there is no problem of solder corrosion, an Au type electrode material strong against the resistance element can be used, thereby enabling further improvement in the reliability of the resistance element and the electrodes.

Furthermore, at the time of electrode plating, since a large substrate can be plated as a whole, it is not necessary to perform barrel plating, and more uniform plating than the barrel plating can be applied to a small chip resistor.

Figure 12:
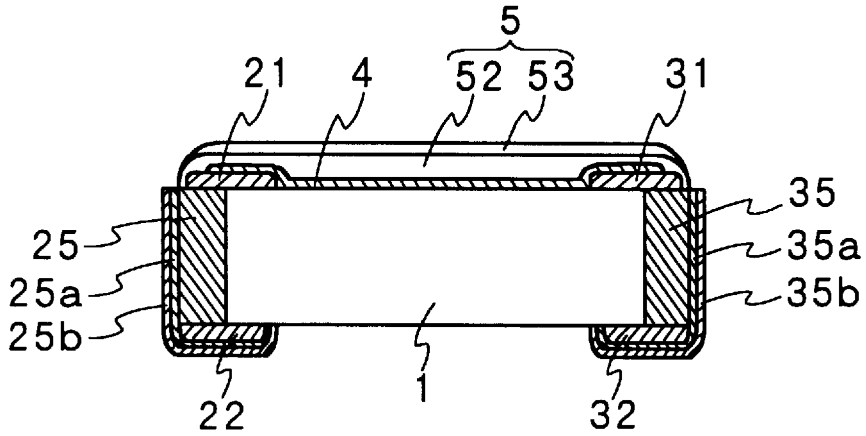
FIG. 12 is a cross section drawing showing further another embodiment of a chip resistor according to the present invention.

FIG. 12 is an embodiment showing a modified example of FIG. 9, wherein through holes provided in a large substrate are formed in portions to be divided into chips, through hole electrodes 25, 35 are formed in the through holes, to expose the through hole electrodes 25, 35 to the sides. After divided into chips, electrode plating is performed. Therefore, this example is different from the example shown in FIG. 9 in that Ni plating layers 25*a*, 35*a* and solder plating layers 25*b*, 35*b* are formed also on the sides of the through hole electrodes 25, 35, but other construction is the same as the construction shown in FIG. 9. The same reference symbols are given to the same parts, and description thereof is omitted.

Figure 13:
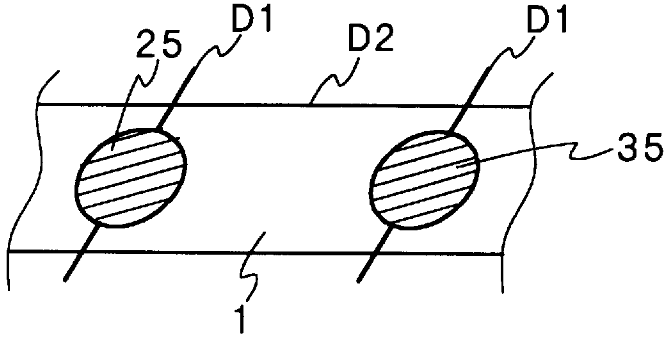
FIGS. 13(*a*) to 3(*c*) are process diagrams of a main part for manufacturing the chip resistor in FIG. 12.
Figure 13:
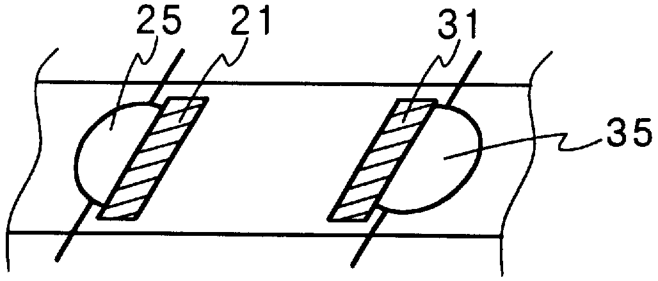
Figure 13:
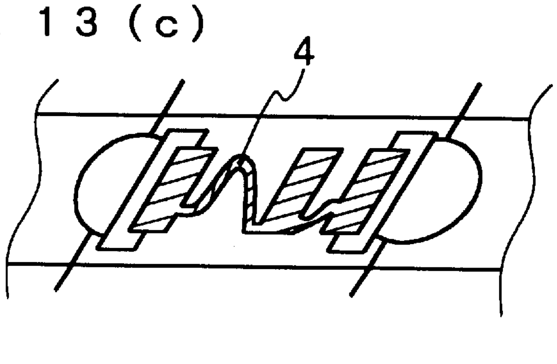
Figure 14:
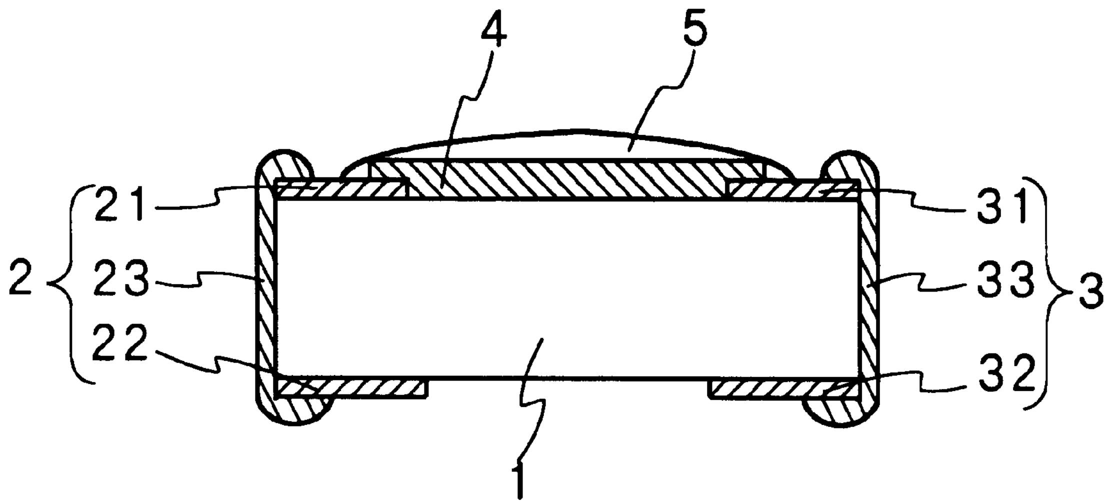
FIG. 14 PRIOR ART
FIG. 14 is a cross section drawing showing a construction of a conventional chip resistor.

In order to manufacture this chip resistor, first, as shown in FIG. 13(*a*), through holes are formed on division lines D1 corresponding to the opposite ends in the direction of forming a resistance element, of lines D1, D2 of a large substrate for dividing into chips. A conductive paste (conductive electrode paste) is printed in the through holes and dried to thereby form through hole electrodes 25, 35. Then, the conductive paste is printed on the surface of the insulating substrate 1 and dried, and fired at a temperature of from 400 to 800° C., to thereby form back surface electrodes 22, 32. Thereafter, in the same manner as the manufacturing method in the construction shown in FIG. 9 described above, top surface electrodes 21, 31 are formed by printing and drying of the conductive paste (FIG. 13(*b*)), a resistive material film is formed by sputtering or the like and patterned in a desired shape, to thereby form a thin-film resistance element 4 (FIG. 13(*c*)). Thereafter, laser trimming is performed, while measuring the resistance value, to adjust the resistance value to a desired value.

Then, in the same manner as in the above example, a protective film 5 (52, 53) consisting of a glass or a resin is formed in one or two layers over the surface thereof. In this case, the protective film 5 may be formed by printing over the whole surface, as described above. Thereafter, by dividing this substrate into individual chips, and forming Ni plating layers 25*a*, 35*a* and solder plating layers 25*b*, 35*b* by barrel plating or the like, chip resistor shown in FIG. 12 is obtained.

Also according to this example, as in the example shown in FIG. 9, while being constituted of a thin-film resistance element and thick-film electrodes, this chip resistor can achieve high performance by means of the thin-film resistance element and cost reduction by means of the thick-film electrodes, without causing a problem of adhesion between the thin-film resistance element and the thick-film electrodes. Moreover, this case is the same with the case shown in FIG. 9 in that the protective film can be formed over the whole surface including the top surface electrodes, and hence the surface of the protective film can be made flat. Gas or water content can be suppressed from entering under the plating solution or under use environment, thereby enabling improvement in reliability.

In the example shown in FIG. 12, the construction is such that each of through hole electrodes is buried in over the whole through hole. However, the construction may be such that the through hole electrode adhered to the inner wall of the through hole is formed, without being filled in the whole through hole, by adhering the conductive paste so as to drip into the through hole. According to this construction, it is easy to break a large substrate at the time of dividing into chips, and the substrate can be divided by a break by means of a slit, without cutting by a dicer or the like. Moreover, the Ni and solder plating layers of the through hole electrodes can be formed in the through holes, and the plating component does not protrude to the outside. Also at the time of soldering to a mounting board, a solder fillet is formed only in the through hole, and hence, it is not necessary to increase the mounting area so much. Thus, while obtaining the same effect as the fillet-less example described above, a fillet can be formed, enabling improvement in the soldering reliability.

According to the present invention, a high performance resistor can be obtained by forming the resistance element that largely affects the resistance characteristics by a thin film, while other electrodes are all formed by a thick film, to thereby simplify the production process, enabling production of the chip resistor with small man-hour, at a very low price. Furthermore, a problem of adhesion due to forming a thick film on a thin film can be solved, and hence decrease in performance hardly occurs, compared to a case where all these electrodes are formed by thin films.

Although preferred examples have been described in some detail it is to be understood that certain changes can be made by those skilled in the art without departing from the spirit and scope of the invention as defined by the appended claims.

What is claimed is:

1. A chip resistor, comprising:

an insulating substrate;

a resistance element formed by a thin film so as to extend from one end to the other opposite end of said insulating substrate on the surface thereof;

top surface electrodes formed by a thick film at the opposite ends of said insulating substrate, so as to be connected to the opposite ends of said resistance element, respectively;

back surface electrodes formed by a thick film on the back side of said insulating substrate, said back surface electrodes being electrically connected to said top surface electrodes via thick-film electrodes, respectively; and a protective film provided on the surface of said resistance element;

wherein each of said top surface electrodes comprises a first top surface electrode and a second top surface electrode, and each of the opposite ends of said resistance element is clamped in a sandwich construction by said first top surface electrode and said second top surface electrode provided on the surface of said insulating substrate, with a part of each of the opposite ends of said resistance element removed so that said first top surface electrode and said second top surface electrode come in direct contact with each other, and said second top surface electrode and each of said back surface electrodes are connected by each of side surface electrodes formed by a thick film on the side of said insulating substrate, respectively.

2. The chip resistor of claim 1 manufactured by, the method comprising:

providing a pair of first top surface electrodes at the opposite ends of an insulating substrate by a thick-film forming method;

forming a resistance element film on said first top surface electrodes and said exposed insulating substrate by a thin-film forming method, and performing patterning so as to expose a part of each of said first top surface electrodes and to have a desired shape to thereby form a resistance element; and providing a pair of second top surface electrodes by a thick-film forming method, so as to overlap on said pair of first top surface electrodes.

3. A chip resistor, comprising:

an insulating substrate;

a resistance element formed by a thin film so as to extend from one end to the other opposite end of said insulating substrate on the surface thereof;

top surface electrodes formed by a thick film at the opposite ends of said insulating substrate, so as to be connected to the opposite ends of said resistance element, respectively;

back surface electrodes formed by a thick film on the back side of said insulating substrate, said back surface electrodes being electrically connected to said top surface electrodes via thick-film electrodes, respectively; and a protective film provided on the surface of said resistance element;

wherein said resistance element formed by a thin film comprises a laminated structure having a first layer and a second layer, each of the opposite ends of the resistance element clamps each of said top surface electrodes between said first layer and said second layer in a sandwich construction, and said first layer is provided with an exposed portion of said insulating substrate so that said top surface electrodes come in direct contact with said insulating substrate, and said second layer is formed such that each of said top surface electrodes has an exposed portion not covered with said second layer.

4. A chip resistor, comprising:

an insulating substrate;

a resistance element formed by a thin film so as to extend from one end to the other opposite end of said insulating substrate on the surface thereof;

top surface electrodes formed by a thick film at the opposite ends of said insulating substrate, so as to be connected to the opposite ends of said resistance element, respectively;

back surface electrodes formed by a thick film on the back side of said insulating substrate, said back surface electrodes being electrically connected to said top surface electrodes via thick-film electrodes, respectively; and a protective film provided on the surface of said resistance element;

wherein said resistance element is formed on said insulating substrate, each of said top surface electrodes is formed on the opposite ends of said resistance element, and thin-film top surface electrodes are formed so as to cover a part of each of said top surface electrodes and a part of said resistance element at the opposite ends, and the exposed portion of each of said top surface electrodes and each of said back surface electrodes is connected by each of side surface electrodes provided by a thick film on the side of said insulating substrate.

5. A chip resistor comprising:

an insulating substrate;

a resistance element formed by a thin film so as to extend from one end to the other opposite end of said insulating substrate on the surface thereof;

top surface electrodes formed by a thick film at the opposite ends of said insulating substrate, so as to be connected to the opposite ends of the resistance element, respectively, and to expose at least a part of each of said top surface electrodes on the surface side;

thin film top surface electrodes provided so as to cover a part of each of said top surface electrodes and a part of said resistance element at the opposite ends;

bump electrodes provided so as to be electrically connected to each of said top surface electrodes; and a protective film provided on the surface of said resistance element.

6. A chip resistor, comprising:

an insulating substrate;

a resistance element formed by a thin film so as to extend from one end to the other opposite end of said insulating substrate on the surface thereof;

top surface electrodes formed by a thick film at the opposite ends of said insulating substrate, so as to be connected to the opposite ends of the resistance element, respectively, and to expose at least a part of each of said top surface electrodes on the surface side;

bump electrodes provided so as to be electrically connected to each of said top surface electrodes; and a protective film provided on the surface of said resistance element;

wherein each of said top surface electrodes comprises a first top surface electrode and a second top surface electrode, and each of the opposite ends of said resistance element is clamped in a sandwich construction by said first top surface electrode and said second top surface electrode provided on the surface of said insulating substrate, with a part of each of the opposite ends of said resistance element removed so that said first top surface electrode and said second top surface electrode come in direct contact with each other, and each of said bump electrodes is formed on the surface side of said second top surface electrode.

* * * * *